United States Patent
Cahill et al.

(10) Patent No.: US 9,859,188 B2
(45) Date of Patent: Jan. 2, 2018

(54) HEAT ISOLATION STRUCTURES FOR HIGH BANDWIDTH INTERCONNECTS

(71) Applicant: ROSENBERGER HOCHFREQUENZTECHNIK GMBH & CO. KG, Fridolfing (DE)

(72) Inventors: Sean S. Cahill, Santa Clara, CA (US); Eric A. Sanjuan, Santa Clara, CA (US)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 0 days.

(21) Appl. No.: 14/902,171

(22) PCT Filed: Jul. 2, 2014

(86) PCT No.: PCT/EP2014/001820
§ 371 (c)(1),
(2) Date: Dec. 30, 2015

(87) PCT Pub. No.: WO2015/000591
PCT Pub. Date: Jan. 8, 2015

(65) Prior Publication Data
US 2016/0379911 A1    Dec. 29, 2016

Related U.S. Application Data

(60) Provisional application No. 61/842,955, filed on Jul. 3, 2013.

(51) Int. Cl.
*H01L 23/367* (2006.01)
*H01L 23/467* (2006.01)
(Continued)

(52) U.S. Cl.
CPC ...... *H01L 23/3677* (2013.01); *H01L 23/3675* (2013.01); *H01L 23/3737* (2013.01);
(Continued)

(58) Field of Classification Search
CPC . H01L 23/3677; H01L 24/09; H01L 23/3675; H01L 25/167; H01L 23/3737;
(Continued)

(56) References Cited

U.S. PATENT DOCUMENTS 6,137,165 A * 10/2000  Thierry .............. H03K 17/0822
                                                          257/204
6,956,283 B1    10/2005  Peterson
(Continued)

FOREIGN PATENT DOCUMENTS

| JP | 2002033426 A | 1/2002 |
| JP | 2010267701 A | 11/2010 |
| WO | 03026084 A1 | 3/2003 |

*Primary Examiner* — Dale E Page
*Assistant Examiner* — Mohammed R Alam
(74) *Attorney, Agent, or Firm* — DeLio, Peterson & Curcio, LLC; Robert Curcio

(57) ABSTRACT

A die interconnect system having a plurality of connection pads, a heat generating element thermally isolated from the die, one or more leads extending from the die to the heat generating element, each lead having a metal core with a core diameter, a dielectric layer surrounding the metal core with a dielectric thickness, and an outer metal layer attached to ground, wherein one or more leads are exposed to ambient conditions and/or are convectively or contact cooled for at least a portion of their length to minimize heat transfer from the heat generating element to the die.

16 Claims, 5 Drawing Sheets

(51) Int. Cl.
*H01L 23/66* (2006.01)
*H01L 23/00* (2006.01)
*H01S 5/022* (2006.01)
*H01S 5/024* (2006.01)
*H01L 23/373* (2006.01)
*H01L 25/16* (2006.01)

(52) U.S. Cl.
CPC ............ *H01L 23/467* (2013.01); *H01L 23/66* (2013.01); *H01L 24/09* (2013.01); *H01L 24/48* (2013.01); *H01L 24/49* (2013.01); *H01L 24/85* (2013.01); *H01L 24/97* (2013.01); *H01L 25/167* (2013.01); *H01S 5/02248* (2013.01); *H01S 5/02276* (2013.01); *H01S 5/02469* (2013.01); *H01L 2223/6611* (2013.01); *H01L 2224/2784* (2013.01); *H01L 2224/4569* (2013.01); *H01L 2224/45565* (2013.01); *H01L 2224/48091* (2013.01); *H01L 2224/48145* (2013.01); *H01L 2224/48227* (2013.01); *H01L 2224/48247* (2013.01); *H01L 2224/4903* (2013.01); *H01L 2224/8592* (2013.01); *H01L 2224/85444* (2013.01); *H01L 2224/85935* (2013.01); *H01L 2224/85939* (2013.01); *H01L 2924/00014* (2013.01); *H01L 2924/15311* (2013.01); *H01L 2924/181* (2013.01); *H01L 2924/19107* (2013.01)

(58) Field of Classification Search
CPC ..... H01L 23/5387; H01L 24/48; H01L 24/73; H01L 2224/17181; H01L 2224/16227; H01L 2224/13025; H01L 2224/06181; H01L 2924/14; H01L 2924/00014; H01L 2224/48465; H01L 2224/73257; H01L 2224/4556; H01L 2224/45565; H01L 2224/4557; H01L 2224/45572; H01L 2224/45573; H01L 2224/45574; H01S 5/02276; H01S 5/02248; H01S 5/02469; H05K 3/222
See application file for complete search history.

(56) References Cited

U.S. PATENT DOCUMENTS

| | | | |
|---|---|---|---|
| 8,299,588 B1* | 10/2012 | Tateishi | H01L 23/49562 257/676 |
| 2002/0121671 A1* | 9/2002 | Wakisaka | H01S 5/02276 257/467 |
| 2003/0116869 A1* | 6/2003 | Siu | F25B 21/02 257/653 |
| 2004/0262782 A1* | 12/2004 | Ellis | H01L 21/563 257/787 |
| 2008/0205008 A1* | 8/2008 | Sun | H01L 25/16 361/736 |
| 2009/0159320 A1* | 6/2009 | Sanjuan | H01L 23/047 174/260 |
| 2010/0213471 A1* | 8/2010 | Fukasawa | H01L 24/34 257/82 |
| 2012/0050989 A1* | 3/2012 | Bhagavat | H01L 23/467 361/694 |
| 2014/0291819 A1* | 10/2014 | Barth | H01L 23/53276 257/659 |
| 2015/0202871 A1* | 7/2015 | Cruz-Uribe | B41J 2/045 347/71 |

* cited by examiner

HEAT ISOLATION STRUCTURES FOR HIGH BANDWIDTH INTERCONNECTS

BACKGROUND OF THE INVENTION

1. Field of the Invention

Heat isolation structures that reduce heat transfer to or from a die while still allowing high bandwidth interconnects are described. A low power die can be isolated from heat of a high power die, or from heat generated by high power lasers or the like.

2. Description of Related Art

Electronic devices and components are operating at ever increasing speeds and over increasing frequency ranges. Popular semiconductor package types use wire bonds that can connect to a substrate or leadframe, which in turn can connect to second level interconnects, vias, substrate or package traces, solder balls, or the like, for connection to a printed circuit board (PCB) of an electronic device.

As speed increases, so does power requirements and the need to transfer waste heat away from the die. This is a particular problem for stacked dies, interior dies in a stack being effectively insulated on top and bottom by substrate materials or other heat generating dies.

SUMMARY OF THE INVENTION

Bearing in mind the problems and deficiencies of the prior art, it is an object of the present invention to provide an interconnect system with at least one die with an effective removal of waste heat generated by a heat generating element like a thermally active die.

The above and other objects, which will be apparent to those skilled in the art, are achieved in the present invention which is directed to a die interconnect system, comprising a die having a plurality of connection pads, a heat generating element thermally isolated from the die, one or more leads extending from the die to the heat generating element, each lead having a metal core with a core diameter, a dielectric layer surrounding the metal core with a dielectric thickness, and an outer metal layer attached to ground, wherein at least one lead is exposed to ambient conditions and/or is convectively or contact cooled for at least a portion of its length to minimize heat transfer from the heat generating element to the die. The lead may be a ribbon lead. The dependent claims are directed to advantageous embodiments of the invention.

Alternatively, sensitive sensor elements or other electronic components can be isolated from heat generated by a high power die. In this case, the at least one lead extends from the high power die to the heat sensitive electronic component.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 1-6 of the drawings in which like numerals refer to like features of the invention.

Figure 1:
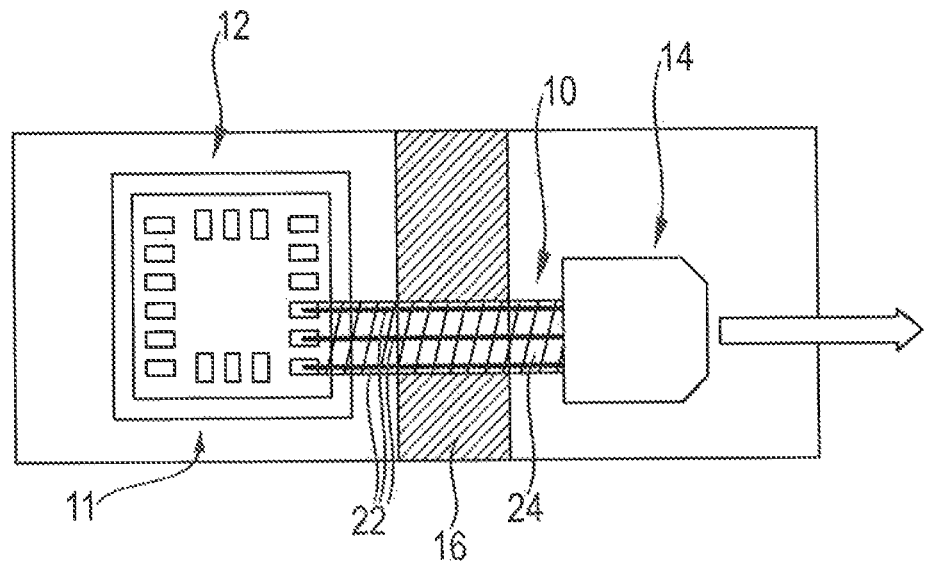
FIGS. 1 and 2 are respective plan and side illustrations of a high bandwidth die to laser module interconnect structure, with the die and laser modules to be thermally isolated from each other.
Figure 2:
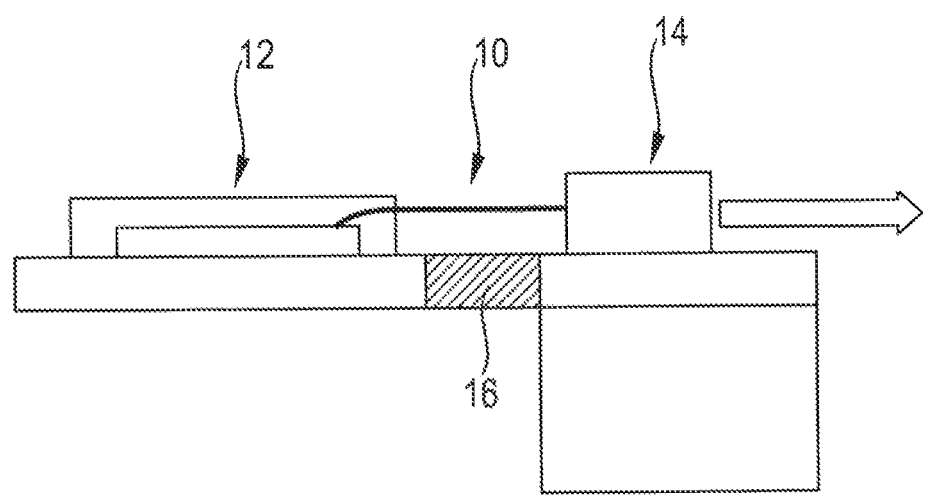

As seen in FIG. 1, one or more ribbon leads 10 (or individual leads in other embodiments) suitable for high bandwidth interconnection are used to connect between a semiconductor die package 12 and a thermally active die, laser module 14, or other heat generating element. As seen in FIG. 1, a heat generating laser module 14 capable of high speed emission of coherent light (arrow) is mounted on a heat slug. The module 14 is thermally isolated to the greatest extent possible by interposition of a low thermal transmissivity substrate section 16, which can include inorganic materials, polymers, composite materials such as inorganic clay supported in polymers, air, oriented materials, or the like. The number of connecting leads and the thermal conductivity of the ribbon 10 is further minimized by high bandwidth signaling, optionally coupled with thin outer metallization layers. In still other embodiments, the thermal transmissivity can be further reduced by providing a non-metal outer conductive coating such as can be provided by oriented graphene or indium tin oxide. The ribbon 10 can be formed from leads having dielectric coated metal cores 22, with the dielectric coating 24 completely fused, partially fused, or in certain embodiments unfused, along the length of the lead. The ribbon leads 10 extend outside the package 12 into ambient air to help transfer heat away from the heat generating element.

Alternatively, the ribbon lead 10 can be convectively or contact cooled by suitable active or passive thermal heat sinks, including moving air or liquid, high thermal conductivity metal or other heat sinks, or active cooling agents such as piezoelectric coolers. Together, the thermal isolation and heat transfer into ambient air can help prevent damage to the die from the extreme thermal conditions produced during operation of the laser module.

In alternative embodiments, using similar thermal isolation structures, sensitive sensor elements or other electronic components can be isolated from heat generated by a high power die. This can be of utility, for example, for die connected to thermal bolometers, or sensitive CCD, or CMOS light detecting arrays.

The dielectric coating is covered with outer ground connected metallization that provides desired thermal and electrical characteristics while also improving mechanical characteristics and resistance to polymer degradation through oxidation or other chemical effects. In another embodiment, first and second dies respectively having connection pads are interconnected by two separate ribbons composed of fused dielectric coating that is encapsulated with metal. The process of forming a ribbon interconnect begins with attachment of a metal core of a lead to die and substrate connection pads. The metal core is coated with a dielectric and metallized, with the metal being connected to a ground (possibly requiring a separate laser ablation or other step of dielectric removal to allow access to ground connection pads). For cavity packages, the die can be fitted with a hermetic lid or other cover. Otherwise the die can be covered with a mold compound, an epoxy glob top, or other suitable encapsulant material, separately (with the ribbon lead(s) extending out of the encapsulating material), or together in one multi-die package as required.

In another embodiment, ribbon leads suitable for interconnecting semiconductor die packages or extending between dies within a package are of particular use in stacked die embodiments. Die substrates need for rerouting are typically formed from electrically insulative material that also has poor thermal conductivity. Using ribbon leads formed from fused dielectric coated metal cores with a ground connectable outermost metallization layer, it is possible to remove heat from interior die, as well as transfer heat from a die to a substrate.

In another embodiment, a package-to-package connection using a ribbon lead such as discussed above as well as a die to die interconnection in a common mold package, and/or a die-to-substrate ribbon connection are used. Further, stacked packages are also supported, with ribbons extending between stacked dies. The ribbon interconnecting the packages may be attached to a "winged" heat dissipating copper or aluminum sink or slug to enhance heat transfer and dissipation. Active or passive air or liquid cooling can be used to remove heat from the winged slug if desired.

In certain embodiments thermal and electrical characteristics of the ribbon can be adjusted by having dielectric coated leads used in semiconductor die packaging formed to have varying dielectric thickness. Thick, thin, and intermediate thicknesses are possible by varying dielectric coating times and manufacture steps. Both the core diameter and the dielectric thickness can be varied. In certain embodiments the composition of the deposited dielectric can be also varied, with for example distinct dielectric materials surrounding a metal core and in turn be surrounded by a ground connectable metal coating. This allows, for example, a high performance dielectric having superior vapor barrier, oxygen degradation resistance, or the like, to be thinly deposited over a thick layer of a low cost dielectric material. In still other embodiments multiple layers of dielectric of varying thickness, can be separated by thin metal layers, with the outermost metal layer being connected to ground.

Generally, thin dielectric layers will provide low impedance good for power lines, thick dielectric layers are good for signal integrity, and outer metal layers are connected to the same ground. Note that a combination of core diameters and dielectric thicknesses is possible and a series of such steps may be performed to achieve more than two impedances. In certain embodiments it may be desirable to have large cores on power lines to increase power handling capacity, reduce power line temperatures, and/or further reduce any inductance on power supply and ground lines that would exacerbate ground bounce or power sag. Dielectric layers of intermediate thickness are also useful, since many packages could benefit from having leads of three (3) or more different dielectric thicknesses. For example, a lead may have an intermediate dielectric thickness which could be used to connect a source and load of substantially different impedance to maximize power transfer. For example, a 10 ohm source can be coupled to a 40 ohm load with a 20 ohm lead. Also, since cost of the dielectric can be high, critical signal pathways can be interconnected using thick dielectric, with less critical status, reset, or the like leads can be coated with a dielectric layer having a thickness greater than the power leads, but less than (intermediate) to the critical signal leads. Advantageously, this can reduce dielectric deposition material cost and time.

The precise thickness of the dielectric coating may be chosen, in combination with the wirebond diameter, to achieve a particular desired impedance value for each lead.

$$Z_0 = \sqrt{\frac{L}{C}} = \frac{138}{\sqrt{\varepsilon_r}} \cdot \log\left(\frac{b}{a}\right) \quad (1)$$

The characteristic impedance of a coax line is given in Eq. (1), where L is the inductance per unit length, C is the capacitance per unit length, a is the diameter of the bond wire, b is the outside diameter of the dielectric and $\varepsilon_r$ is relative permittivity of the coaxial dielectric.

Figure 3:
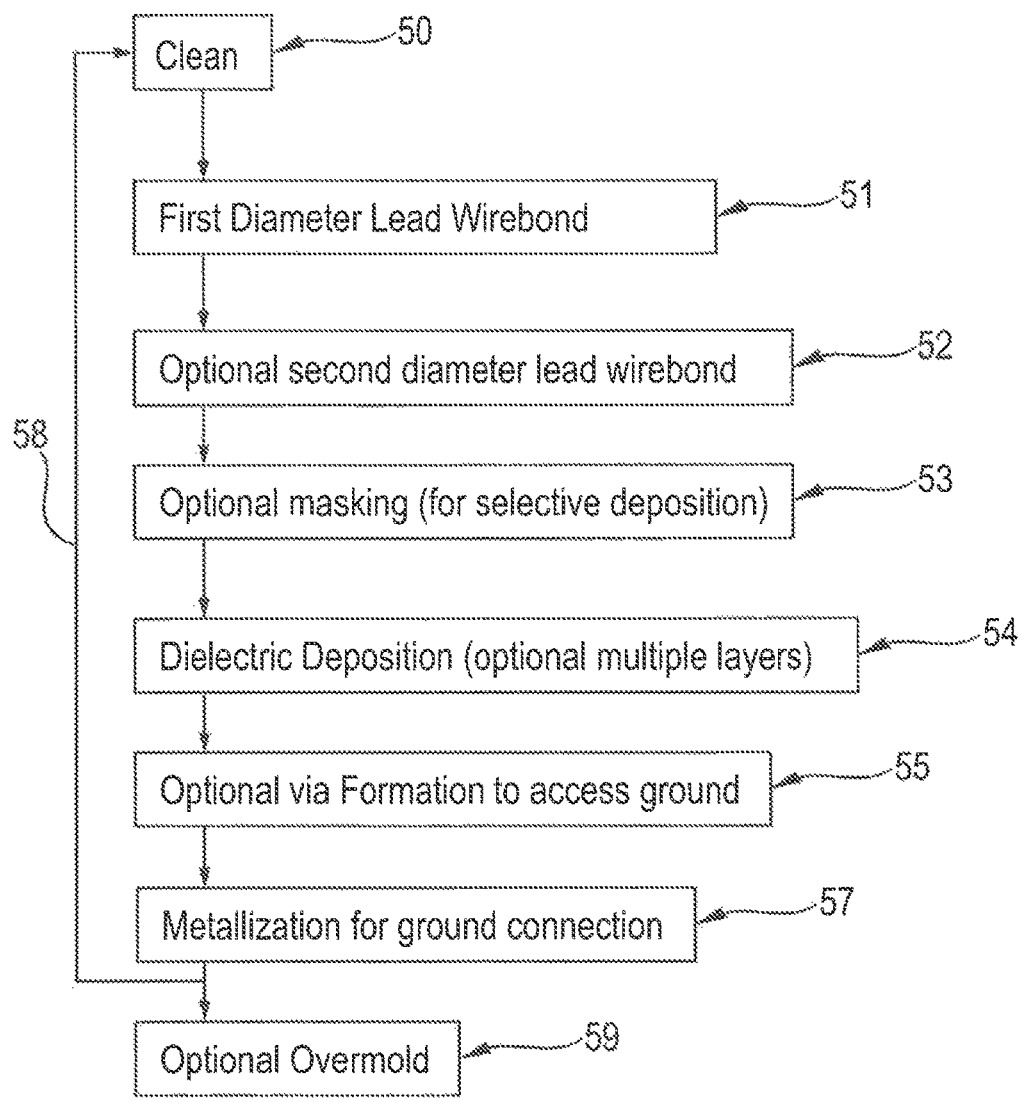
FIG. 3 illustrates method steps for manufacture of dielectric coated leads with outer ground connected metallization.
Figure 4:
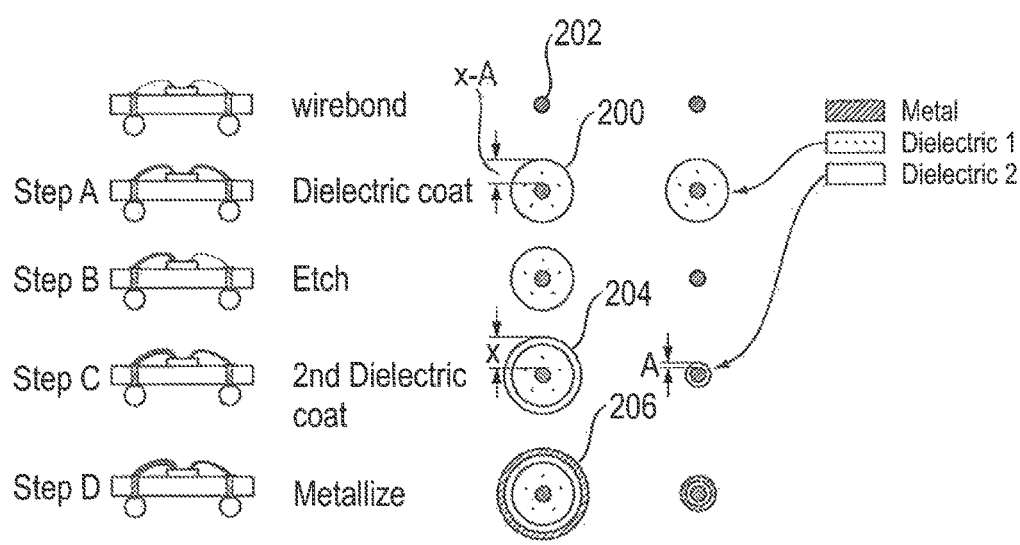
FIG. 4 illustrates a subtractive method for manufacture of dielectric coated leads with outer ground connected metallization.

As illustrated in FIG. 3, in one embodiment manufacture of dielectric coated leads with outer ground connected metallization can proceed using the following steps. Connection pads are cleaned (50) on the die and the substrate and a wirebonder is used to connect the die to the connection pads (51). Optionally, a second diameter wire can be attached (52) (e.g., a larger diameter wire suitable for power connections), or areas of the die can be masked (53) or otherwise protected to allow for selective deposition. One or more layers of dielectric of the same or different composition can be deposited (54), followed by selective laser or thermal ablation, or chemical removal of portions of the dielectric to allow access to ground connections covered in the dielectric deposition step (55). This step is optional, since in some embodiments, the need for a ground via can be eliminated. This is particularly true for die operating at higher frequencies, since a virtual RF ground may be established through capacitive coupling. Metallization (57) follows, covering the dielectric with a metal layer that forms the outermost metallized layer of the leads, and also connecting the leads to ground. The entire process can be repeated multiple times (58), useful for those embodiments using selective deposition techniques, and particularly for those embodiments supporting multiple die or complex and varied impedance leads. In the final step, for non-cavity packages, an overmold can be used to encapsulate leads (59).

In certain embodiments, modifications and additions to the described process are possible. For example, providing conformal coatings of dielectric can be accomplished through a variety of methods using chemical (electrophoretic), mechanical (surface tension), catalytic (primer, electromagnetic [UV, IR], electron beam), other suitable techniques. Electrophoretic polymers are particularly advantageous because they can rely on self-limiting reactions that can deposit precise thicknesses readily by adjusting process parameters and or simple additive, concentration, chemical, thermal, or timing changes to an electrophoretic coating solution.

In other embodiments, dielectric precoated bondwires can be used to form leads. While commercially available coated wires typically are thinner in dielectric thickness than is necessary to create, for example, 50 ohm leads, the foregoing discussed dielectric deposition steps can be used to increase dielectric thickness to set the desired impedance. Use of these precoated wires can simplify other process steps necessary to create coaxes, and can allow for thinner layers of needed vapor deposited dielectrics and faster processing times to create ground vias. Precoated bondwires can be used to prevent shorting for narrowly spaced or crossing leads. In certain embodiments the precoated bondwire can have a dielectric made from a photosensitive material to allow for selective patterning techniques.

In other embodiments, the dielectric Parylene™ can be used. Parylene™ is the trade name for a variety of chemical vapor deposited poly(p-xylylene)polymers used as moisture and dielectric barriers. Parylene™ can be formed in a growth limited condensation reaction using a modified Parylene™ deposition system where the die, substrate, and leads are aligned to a photoplate which allows EM radiation (IR, UV or other) to strike in a precise manner causing selective growth rate of dielectric. Advantageously, this can minimize or eliminate the need for processes to create contact vias, bulk removal of Parylene™, etc.

Parylene™ and other dielectrics are known to suffer from degradation due to oxygen scission in the presence of oxygen, water vapor, and heat. Damage can be limited by metal layers that form excellent oxygen vapor barriers, with thin layers of 3-5 micron thickness capable of forming true hermetic interfaces.

Alternatively, if metal has been selectively removed, or not deposited in certain areas due to electrical, thermal, or manufacturing requirements, a wide range of polymer based vapor oxygen barriers can be used, with polyvinyl alcohol (PVA) being one widely used polymer. These polymers can be glob topped, screen printed, stenciled, gantry dispensed, sprayed onto Parylene™ surface that will be exposed to the oxygen or $H_2O$ vapor environment. Advantageously, use of vapor barrier polymers can be a part of a cost reduction strategy, since thicker layers of high cost Parylene™ or other oxygen sensitive might otherwise be required.

As will be appreciated, all of the described method steps can benefit from various selective deposition techniques. Selective deposition can be by physical masking, directed polymer deposition, photoresist methods, or any other suitable method for ensuring differential deposition thickness on the metal core, dielectric layer, or other outermost layer at time of deposition. While selective deposition allows for additive methods to build leads, it also allows for subtractive techniques in which dielectric or metal is removed to form interconnects of differing impedances. For example, a package populated by one or more die can be wire-bonded as appropriate for interconnect of all package and device pads. As seen with respect to FIG. 4, which illustrate steps and structures for manufacture of a die package, the dielectric coating 200 can be deposited (Step A) to a thickness X-A over a wirebond metal conductor 202, where A is the thickness of the dielectric needed for the secondary interconnect impedance. The secondary impedance wirebond dielectrics can be removed (Step B) for example by an etch step, followed by a second coating 204 deposition (Step C) followed by metallization 206 of both interconnects (Step D). This subtractive process will create wirebonds of two distinct impedances.

Figure 5:
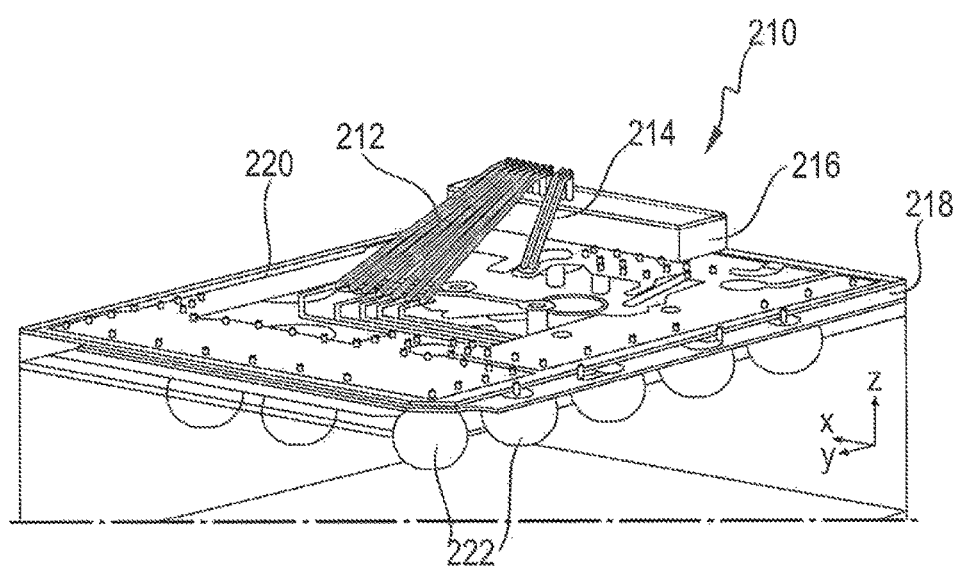
FIG. 5 illustrates a BGA package having dielectric coated leads with outer ground connected metallization.

In an embodiment illustrated with respect to FIG. 5, a ball grid array (BGA) package that includes dielectric and metal coated leads having partial or complete dielectric fusion of selected leads to improve thermal isolation characteristics or provide adequate high bandwidth electrical interconnections is described.

A BGA is a surface-mount packaging widely used for integrated circuits, and can generally provide more interconnection pins than dual in-line, leadframe, or other flat package since the entire bottom surface of the BGA can be used for connection pads. In many types of BGA packages, a die 216 is attached to a substrate 218 having tillable vias 220 connected to connection pads. Wirebonds 212, 214 can be used to connect the top side die 216 to the pads/vias 220, consequently providing electrical connections from a top side of the substrate to the bottom. In a BGA package, balls of solder 222 are attached to the bottom of the package and held in place with a tacky flux until soldering to a printed circuit board or other substrate. As described herein, the wirebonds of conventional BGA packages can be replaced with improved leads having a dielectric layer and an outer ground connectable metal layer. The leads can have varying dielectric thickness over an inner core and an outer metal layer, as well as being selectively optimized to have specific impedances, which can be selected to be different or well-matched based in part on dielectric layer thickness. As seen in the FIG. 5, both long 212 and short 214 leads are supported.

In more detail, assembly of an improved BGA package can require face up attachment of a die to a substrate supporting a connection pad formed adjacent and around a via in the substrate. This assembly is wirebonded as appropriate for each required interconnect, with a wirebond formed between a connection pad on the substrate and a connection pad on the die. Low frequency and power inputs are connected to the low frequency signal leads, while high-frequency inputs and outputs are connected to the high frequency signal leads. In some embodiments, the low frequency and power inputs can have a thickness that differs from high frequency signal leads. The assembly is then subjected to the coating of any essentially conformal dielectric material. Because of its low cost, ease of vacuum deposition, and superior performance characteristics, Parylene™ can be used. A small part of the dielectric layer near the leadframe attachment point can be selectively removed by etch, thermal degradation, or laser ablation, in order to form electrical connection to a ground contact point or ground shield layer.

Similarly, a small portion of the dielectric layer is removed near the die connection pads to permit ground connections. Connection to ground in the structure follows from application of a metallized layer over the top of the dielectric layer, forming a ground shield. The thickness of the preferred metal layer should be chosen in consideration of skin depth and DC resistance issues, and should be composed primarily of an excellent electrical conductor such as silver, copper, or gold. For most applications, a 1 micron coating thickness is adequate for functionality, but thicker coatings can help minimize cross-talk between leads. These coatings may be added in defined areas through a combination of lithography or other masking methods, and plating or other selective deposition methods. The package can be completed by placement of an overmold or lid over the die, followed by dicing (singulation) and testing.

Figure 6:
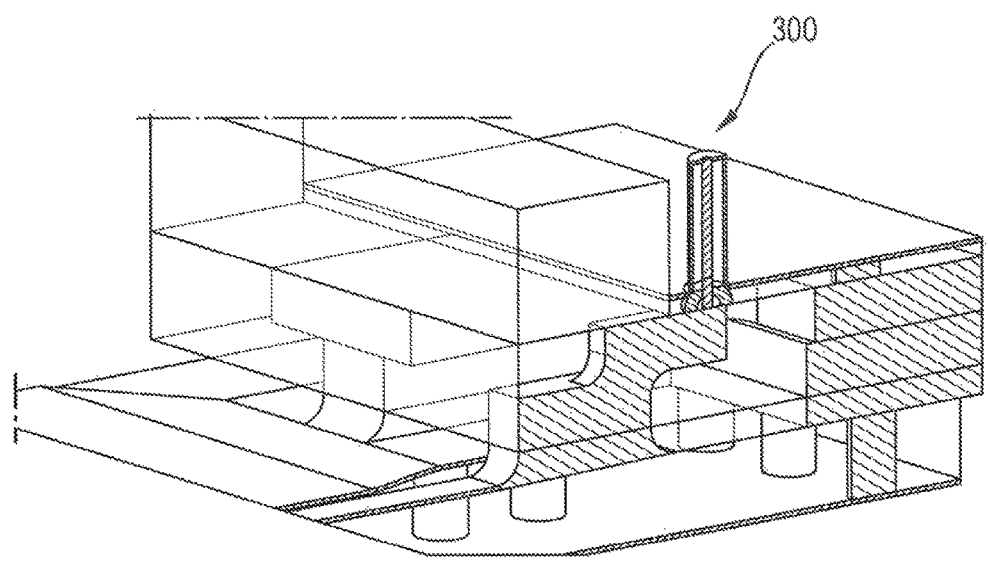
FIG. 6 illustrates a portion of a leadframe package having dielectric coated leads with outer ground connected metallization.

Alternatively, in an embodiment illustrated with respect to FIG. 6, low cost leadframe based die package 300 including wire bonds extending from the die to a leadframe can be manufactured by forming a leadframe strip containing a two dimensional array of individual package sites and outside frame portion. Leadframe fabrication is conventional, and can include formation of separate leads through etching, stamping, or electrodeposition. The leadframe strip can be placed in a mold including, but not limited to, an injection molding or transfer molding apparatus. An appropriate dielectric material, preferably plastic such as commercially available epoxy mold compound, is injected, pumped or otherwise transferred into the mold to achieve a leadframe/mold material composite structure. The properties of the mold material are important for their dielectric constant, loss tangent, and electrically dispersive properties as well as their temperature, moisture, and other mechanical performance attributes.

Each package site on the resulting composite leadframe strip is cleaned of mold release material and or mold-flash, and prepared for deposition of a metal finish over the exposed metal portions of the leadframe. This may be accomplished through plating techniques such as immersion or electroplating, and the metals would be chosen for corrosion suppression and ease of wirebonding. An example of such finishing is a thin layer of nickel (for protection) followed by a layer of gold (added protection and ability to wirebond). Each package site of the resultant molded leadframe strip can then be populated with the required die, which are attached to the base, with die attach material being chosen for mechanical and thermal properties for a particular packaging application. The resultant assembly is then wirebonded as appropriate for each required interconnect, with a wirebond formed between a lead on the leadframe and a connection pad on the die. Low frequency and power inputs are connected to the low frequency signal leads, while high-frequency inputs and outputs are connected to the high frequency signal leads. In some embodiments, the low frequency and power inputs can have a thickness that differs from high frequency signal leads.

Like the foregoing described BGA package 210, the populated leadframe strip is then subjected to the coating of any essentially conformal dielectric material including Parylene™. In the case of Parylene™, it may be preferable to mask the bottom of the packages with tape, such as a vacuum-compatible polyimide with acrylic adhesive, or similar material to prevent deposition onto the area of the leads that will eventually be attached to the PCB. This will facilitate easier soldering at a subsequent step. A small part of the dielectric layer near the leadframe attachment point is selectively removed by etch, thermal degradation, or laser ablation, in order to form electrical connection to a ground contact point or ground shield layer. Similarly, a small portion of the dielectric layer is removed near the die connection pads to permit ground connections. Connection to ground in the structure follows from application of a metallized layer over the top of the dielectric layer, forming a ground shield. The thickness of the preferred metal layer should be chosen in consideration of skin depth and DC resistance issues, and should be composed primarily of an excellent electrical conductor such as silver, copper, or gold. For most applications, a 1 micron coating thickness is adequate for functionality, but thicker coatings can help minimize cross-talk between leads. These coatings may be added in defined areas through a combination of lithography or other masking methods, and plating or other selective deposition methods. The package is completed by placement of an overmold or lid over the die, followed by dicing (singulation) and testing.

In particular, the present invention is directed to a die interconnect system, comprising a die respectively having a plurality of connection pads, a heat generating element thermally isolated from the die, one or more leads extending from a die to the heat generating element, each lead having a metal core with a core diameter, a dielectric layer surrounding the metal core with a dielectric thickness, and an outer metal layer attached to ground, with leads exposed to ambient conditions for at least a portion to minimize heat transfer from the heat generating element to the die.

Further, the present invention includes ribbon leads, non-metallic outer coating, BGA packages, leadframe packages, a die to heat generating element connection on a common substrate, a packaged die to substrate connection, a heat sink or slug connection, a fluid cooling, direct or with a heat sink, and a laser as the heat generating element.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A die interconnect system, comprising:
   a die having a plurality of connection pads;
   a heat generating element thermally isolated from the die;
   more than one lead extending from the die to the heat generating element, each lead having a metal core with a core diameter, a dielectric layer surrounding the metal core with a dielectric thickness, the dielectric layer being covered with an outer metal layer attached to ground, wherein more than one lead is exposed to ambient conditions and/or is convectively or contact cooled for at least a portion of its length to minimize heat transfer from the heat generating element to the die;
   wherein at least one lead is a ribbon lead extending from the die to the heat generating element.

2. The die interconnect system of claim 1, wherein the heat generating element is a laser module.

3. The die interconnect system of claim 1, wherein a low thermal transmissivity substrate section is interposed between the die and the heat generating element.

4. The die interconnect system of claim 3, wherein the low thermal transmissivity substrate section includes inorganic materials, polymers, composite materials, or oriented materials.

5. The die interconnect system of claim 1, including a non-metal outer conductive coating of at least one lead that includes oriented graphene or indium tin oxide.

6. The die interconnect system of claim 1, including an active or passive thermal heat sink cooling the leads by moving air or liquid, high thermal conductivity metal or active cooling agents such as piezoelectric coolers.

7. The die interconnect system of claim 1, wherein the die and the heat generating element are arranged on a common substrate.

8. The die interconnect system of claim 1, including a sensor element, a thermal bolometer, a sensitive Charge Coupled Device (CCD), or Complementary Metal Oxide Semiconductor (CMOS) light detecting element.

9. The die interconnect system of claim 1, including a die substrate having a filled via to allow formation of a Ball Grid Array (BGA) package.

10. The die interconnect system of claim 9 configured for a Ball Grid Array (BGA) package.

11. The die interconnect system of claim 2, wherein a low thermal transmissivity substrate section is interposed between the die and the heat generating element.

12. The die interconnect system of claim 4, wherein said composite material includes inorganic clay supported in polymers.

13. The die interconnect system of claim 4, including a non-metal outer conductive coating of at least one lead that includes oriented graphene or indium tin oxide.

14. The die interconnect system of claim 13, including an active or passive thermal heat sink cooling the leads by moving air or liquid, high thermal conductivity metal or active cooling agents such as piezoelectric coolers.

15. The die interconnect system of claim 4 wherein the low thermal transmissivity substrate section includes inorganic clay supported in polymers or oriented materials.

16. The die interconnect system of claim 1, wherein the dielectric layer is completely or partially fused along the length of the leads.

* * * * *